(12) United States Patent
van der Wagt et al.

(10) Patent No.: US 6,252,430 B1
(45) Date of Patent: Jun. 26, 2001

(54) LATCHING COMPARATOR UTILIZING RESONANT TUNNELING DIODES AND ASSOCIATED METHOD

(75) Inventors: Jan Paul Antoni van der Wagt, Newbury Park, CA (US); Tom Peter Edward Broekaert, Dallas, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/374,737

(22) Filed: Aug. 13, 1999

(51) Int. Cl.[7] ....................................... H03L 5/00
(52) U.S. Cl. .............................. 327/55; 327/77; 327/195
(58) Field of Search ................................ 327/55, 57, 77, 327/89, 195, 196

(56) References Cited

U.S. PATENT DOCUMENTS

| | | | |
|---|---|---|---|
| 5,140,188 | * | 8/1992 Burns .................................... | 327/199 |
| 5,721,503 | * | 2/1998 Burns et al. .......................... | 327/199 |

OTHER PUBLICATIONS

A.C. Seabaugh, et al., "Co–Integrated Resonant Tunneling and Heterojunction Bipolar Transistor Full Adder," IEEE, IEDM 93–419–422, pp. 16.4.1–16.4.4 (1993).

Alan C. Seabaugh et al., "Heterostructures and Quantum Devices: Chapter 11 Resonant–Tunneling Transistors," VLSI Electronics: Microstructure Science, vol. 24 (1994).

A. Seabaugh et al., "Tunnel Diodes" Encyclopedia of Applied Physics, vol. 22, pp. 335–359 (1998).

* cited by examiner

*Primary Examiner*—Toan Tran
*Assistant Examiner*—Linh Nguyen
(74) *Attorney, Agent, or Firm*—O'Keefe, Egan & Peterman

(57) ABSTRACT

A latching comparator and associated method are disclosed that utilize resonant tunneling diodes, or other two-terminal devices possessing regions of negative differential operating resistance in their current-voltage characteristics, and Schottky diodes to provide high speed and reliable analog to digital conversions. In one embodiment, the latching comparator includes a differential amplifier, resonant tunneling diodes, and cross-coupled resistors. The latching comparator may include mode selection circuitry having a track mode signal and a latch mode signal as inputs. In addition, the latching comparator may include a plurality of Schottky diodes connected in series with the resonant tunneling diodes and the cross-coupled resistors.

23 Claims, 4 Drawing Sheets

LATCHING COMPARATOR UTILIZING RESONANT TUNNELING DIODES AND ASSOCIATED METHOD

TECHNICAL FIELD OF THE INVENTION

The present invention relates to converting analog information to digital information. More particularly, the present invention relates to a high frequency latching comparator for analog to digital conversion.

BACKGROUND

Analog to digital conversions are often implemented using quantizers that sample the input analog signal at a selected sampling frequency ($f_S$), make a determination whether the input analog signal is higher or lower than a reference signal, and output a high or low voltage depending upon this determination. The reference signal may be a DC or AC voltage. Quantizers for analog to digital conversions with high frequency input signals and sampling frequencies above 1 GHz must be capable of making decisions quickly and reliably. These high sampling and input frequencies, however, create significant problems in achieving the goal of consistent and correct operation of such circuits.

A prior quantizer implementation to achieve high frequency analog to digital conversion is the latching comparator 100 depicted in FIG. 1 (Prior Art). This prior latching comparator 100 includes a preamplifier portion, including transistors 116 and 122, and a latch portion, including transistors 118 and 120. The preamplifier and latch portions are clocked out of phase using the track signal (TRACK) 130 and the latch signal (LATCH) 132. Mode selection circuitry, which includes tracking control circuitry that receives the track signal (TRACK) 130 and latching control circuitry that receives the latch signal (LATCH) 132, determines whether the latching comparator is in a tracking or latching mode. While illustrated as npn bipolar devices, the transistors 118 and 120 could also be pnp bipolar transistors or field effect transistors (FETs).

Looking at the preamplifier portion of this circuitry in more detail, an input signal ($V_{IN}$) 106 is applied to bias transistor 116. A reference voltage ($V_{REF}$) 124 is connected to bias transistor 122. Resistors 112 and 114 are connected between ground 102 and the collectors of transistors 116 and 122, respectively. The emitters of transistors 116 and 122 are connected together at internal track node 142. Transistor 126, which is the tracking control circuitry, is connected between internal track node 142 and node 140 and has a bias voltage set by the track signal (TRACK) 130. Transistor 136 is connected between node 140 and resistor 138 and has a constant bias voltage set by bias voltage ($V_{BB}$) 134. Resistor 138 is connected between the emitter of transistor 136 and the negative supply voltage ($V_{EE}$) 104. The transistor 136 and the resistor 138 act as a current source in operation.

Looking at the latch portion of this circuitry in more detail, transistor 128 is connected between node 140 and internal latch node 144. Transistor 128, which is the latching control circuitry, is biased by a latch signal (LATCH) 132. Transistors 118 and 120 are connected with the collector of transistor 118 being connected to the base of transistor 120, the collector of transistor 120 being connected to the base of transistor 118, and the emitters of transistors 118 and 120 being connected together to form internal latch node 144. The output ($V_{OUT2}$) 110 is taken from the collectors of transistors 120 and 122, which are connected together. The output ($V_{OUT1}$) 108 is taken from the collectors of transistors 118 and 116, which are connected together.

In operation, when the track signal (TRACK) 130 is high and the latch signal (LATCH) 132 is disabled (LATCH=low), the differential preamplifier portion of the circuitry is enabled. In this tracking mode, the differential output voltage of node ($V_{OU2}$) 110 minus node ($V_{OUT1}$) 108 tracks the input signal ($V_{IN}$) 106. When the latch signal (LATCH) 132 goes high and the preamplifier stage is disabled (TRACK=low), the latching portion of the circuitry is enabled. At that point, the differential output voltage of node ($V_{OUT2}$) 110 minus node ($V_{OUT1}$) 108 will be either high or low. In this latching mode, the cross-coupled latch provided by transistors 118 and 120 establishes a positive feedback loop that amplifies the differential preamplifier output to provide a low or high indication of the input signal ($V_{IN}$) 106. The track signal (TRACK) 130 transitions from high to low and back at the desired sampling frequency ($f_S$). The latch signal (LATCH) is set to be 180 degrees out of phase with respect to the track signal (TRACK) 130. Significantly and disadvantageously, the speed of the resulting latching comparator 100 is limited by the unity current gain frequency ($f_T$) of the transistors 118 and 120.

This prior latching comparator circuit has various disadvantages including operational problems at high speeds and low input voltages. Thus, it is desirable to improve the performance of this prior latching comparator circuit.

SUMMARY OF THE INVENTION

In accordance with the present invention, a latching comparator and associated method are disclosed that utilize resonant tunneling diodes, or other two-terminal devices possessing regions of negative differential operating resistance in their current-voltage characteristics, and Schottky diodes to provide high speed and reliable analog to digital conversions.

In one embodiment, the present invention is a latching comparator including a differential amplifier, first and second two-terminal devices having negative differential operating resistances, and first and second cross-coupled resistors. The differential amplifier has an analog signal and a reference signal as inputs, has a first and second output nodes, and has an internal track node. The first two-terminal device is connected between the first output node and a first internal node. The second two-terminal device is connected between the second output node and a second internal node. The first cross-coupled resistor is connected between the second output node and the first internal node. And the second cross-coupled resistor is connected between the first output node and the second internal node. In addition, the first and the second internal nodes comprise an internal latch node. In more detailed embodiments, the first and second two terminal devices are tunnel diodes or resonant tunneling diodes. The first and second cross coupled resistors comprise a plurality of serially connected resonant tunneling diodes. The reference signal is a DC signal. And the differential amplifier includes two transistors differentially connected.

In a further embodiment, the latching comparator includes mode selection circuitry coupled to the internal track node and the internal latch node and having a track mode signal and a latch mode signal as inputs, respectively. The mode selection circuitry may include a first transistor having the track mode signal as a control voltage and may include a second transistor and a third transistor both having the latch mode signal as a control voltage. In addition, the first, second and third transistors may be hetero-junction bipolar transistors. Also, the latch mode signal may match the track mode signal except for being offset in phase from the track mode signal by 180 degrees. And the input signal and the track mode signal may both have frequencies above 1 GHz.

In still a further embodiment, the latching comparator may include a first Schottky diode connected in series with the first two-terminal device between the first output node and the first internal node, a second Schottky diode connected in series with the second two-terminal device between the second output node and the second internal node, a third Schottky diode connected in series with the first cross-coupled resistor between the second output node and the first internal node, and a fourth Schottky diode connected in series with the second cross-coupled resistor between the first output node and the second internal node.

In another respect, the present invention is a method for converting an analog input signal into digital information including comparing an analog input signal to a reference signal with a differential amplifier to produce a differential output signal and latching the differential output signal high or low with latching circuitry that includes cross-coupled resistors and two-terminal devices having negative differential operating resistances, where the latching circuitry is coupled between differential output nodes of the differential amplifier and the latching control circuitry. In more detailed respects, the two-terminal devices may be resonant tunneling diodes.

In further embodiments, the comparing step may include asserting a track signal coupled to the tracking control circuitry to activate the differential amplifier. The latching step may include asserting a latch signal coupled to the latching control circuitry to activate the latching circuitry so that it latches the high or low state of the differential output signal. And the latching circuitry may further include Schottky diodes connected in series with the two-terminal devices and the cross-coupled resistors.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

The present invention provides an improved latching comparator that utilizes resonant tunneling diodes (RTDs), or other two-terminal devices possessing regions of negative differential operating resistance in their current-voltage characteristics, and Schottky diodes for high frequency applications, for example, those having input and sampling frequencies above 1 GHz.

Figure 1:
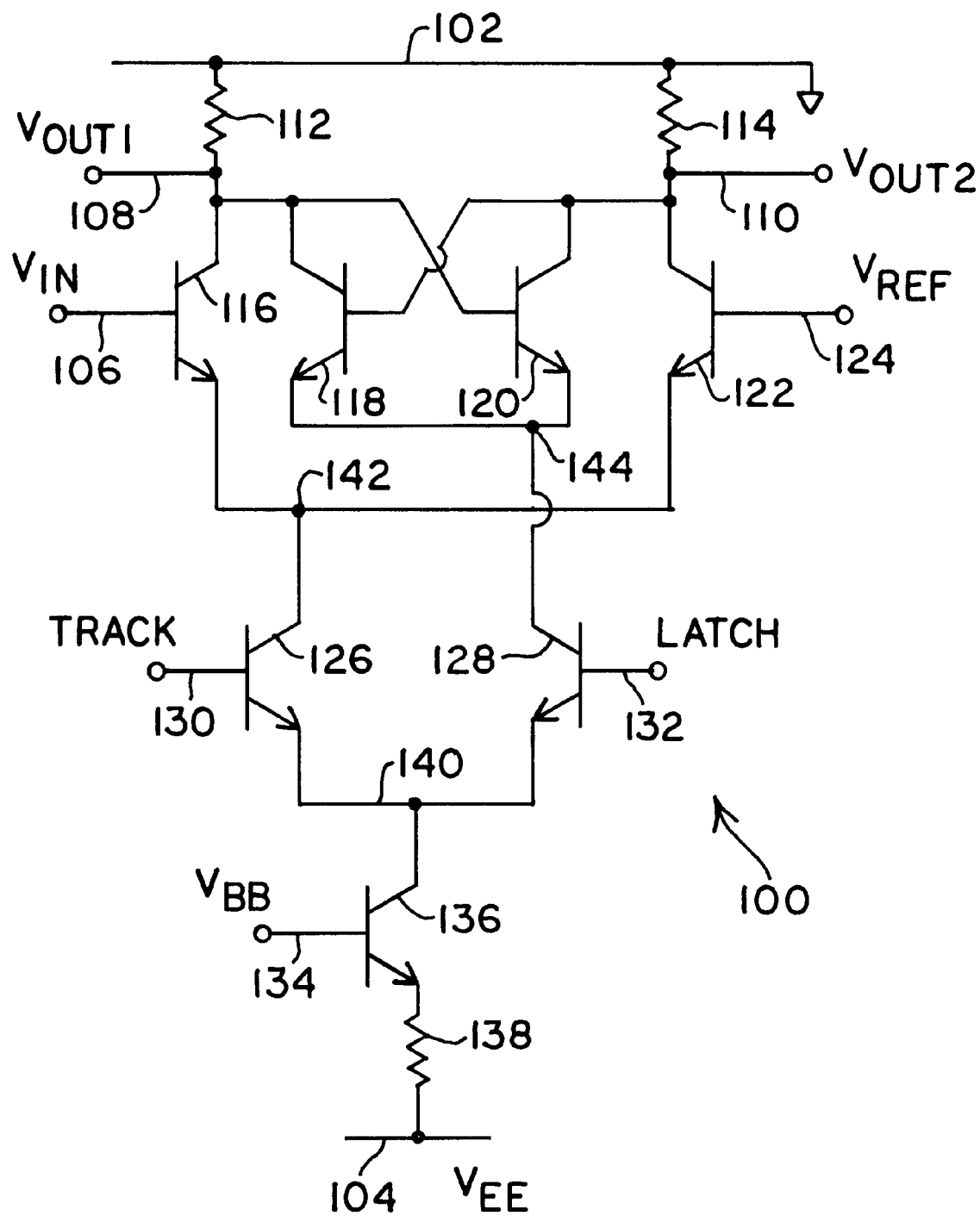
FIG. 1 (Prior Art) is a circuit diagram for a prior implementation of a latching comparator using hetero-junction bipolar transistors.
Figure 2:
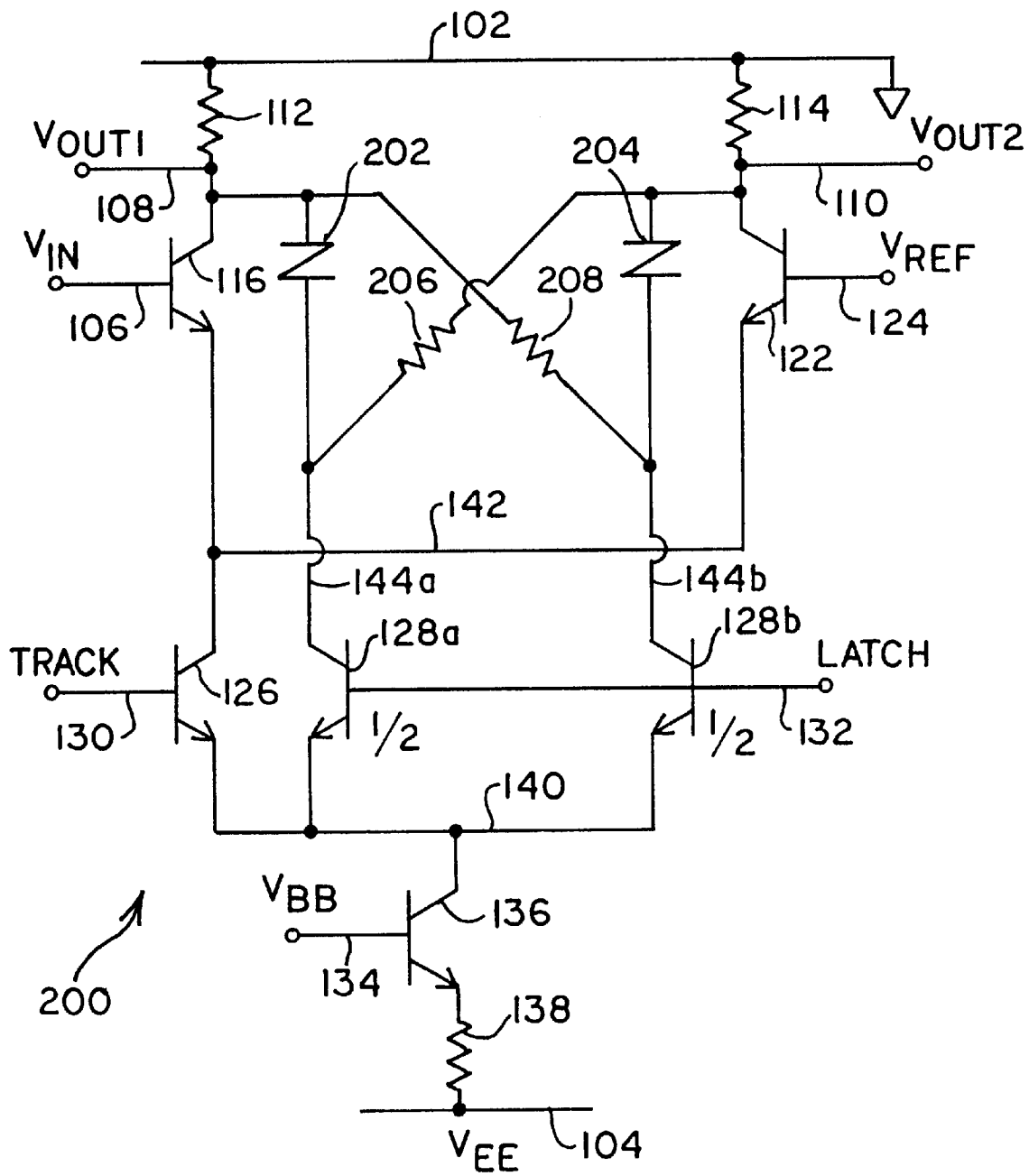
FIG. 2 is a circuit diagram of an embodiment of a latching comparator using resonant tunneling diodes according to the present invention.

FIG. 2 is a circuit diagram of a latching comparator 200 according to the present invention. As compared to the latching comparator 100, the latching comparator 200 has replaced the two latching transistors 118 and 120 with two RTDs 202 and 204 and two cross-coupled resistors 206 and 208. In addition, transistor 128 has been split into two transistors 128a and 128b with about half the transistor device width of transistor 128 in FIG. 1 (Prior Art). This change also breaks internal latch node 144 into nodes 144a and 144b. RTD 202 is connected between the collector of transistor 116 and internal latch node 144a, which is the collector of transistor 128a. Similarly, RTD 204 is connected between the collector of transistor 122 and internal latch node 144b, which is the collector of transistor 128b. Resistor 206 is connected between internal latch node 144a and the collector of transistor 122. Resistor 208 is connected between internal latch node 144b and the collector of transistor 116. It is noted that RTDs and their device characteristics are known, for example, as shown in U.S. Pat. No. 5,140,188 to Burns, which is hereby incorporated by reference in its entirety. As compared to the present invention, the circuitry of the Burns '188 patent suffers from higher power dissipation, low current drive during the amplification (i.e., tracking) phase, and the decision moment is not as well-defined because the input differential pair is not fully switched off during the latching phase which increases aperture time distortion, as discussed further below.

It is noted that that other types of tunnel diodes, such as Esaki tunnel diodes, and other two-terminal devices possessing a region of negative differential resistance in their current voltage characteristic could be used in place of the RTDs 202 and 204 for the present invention. It is further noted that the transistors may be npn hetero-junction bipolar transistors (HBTs). HBTs are desirable because they have a high unity current gain frequency ($f_T$) and can be monolithically integrated with RTDs and Schottky diodes. Other transistors could also be used for the present invention, such as pnp bipolar transistors, n-channel field effect transistors (FETs), or p-channel FETs.

In operation during the tracking mode, the preamplifier portion of the latching comparator 200 works essentially the same as does the preamplifier portion of the prior latching comparator 100 of FIG. 1 (Prior Art). However, in the latching mode, the latching comparator 200 according to the present invention steers current through RTDs 202 and 204. For example, when the current through RTD 202 becomes sufficiently large, RTD 202 starts to move to a high impedance and low voltage state. As the voltage over RTD 202 increases, or the voltage on the internal latch node 144a below RTD 202 decreases, extra current is drawn through the cross coupled resistor 206 to this same internal latch node 144a. This action steals current that otherwise would be available to trigger RTD 204. With proper choice of the parameters values for RTDs 202 and 204 and values for resistors 206 and 208, this current stealing effect ensures that only one of the RTDs 202 and 204 triggers, so that a differential binary output results on the output nodes 108 and 110. Significantly and advantageously, the speed of the latch decision made by the latching comparator 200 according to the present invention is not limited to the ft of the transistors 118 and 120 of the prior latching comparator 100. This enhances the circuit speed of the latching comparator 200.

In addition to the circuit speed advantage, the layout for latching comparator 200 according to the present invention will be more compact than the layout for the latching comparator 100. This is so because the RTDs 202 and 204 may be directly integrated within the HBT device area of the latching comparator 200 by positioning the RTDs 202 and 204 physically on top of transistors 116, 122, 128a and 128b.

Compact layout is an important issue because many latching comparators are required for a full analog-to-digital converter, and a large layout area can cause noticeable signal skew at conversion rates above 1 GHz.

Figure 3:
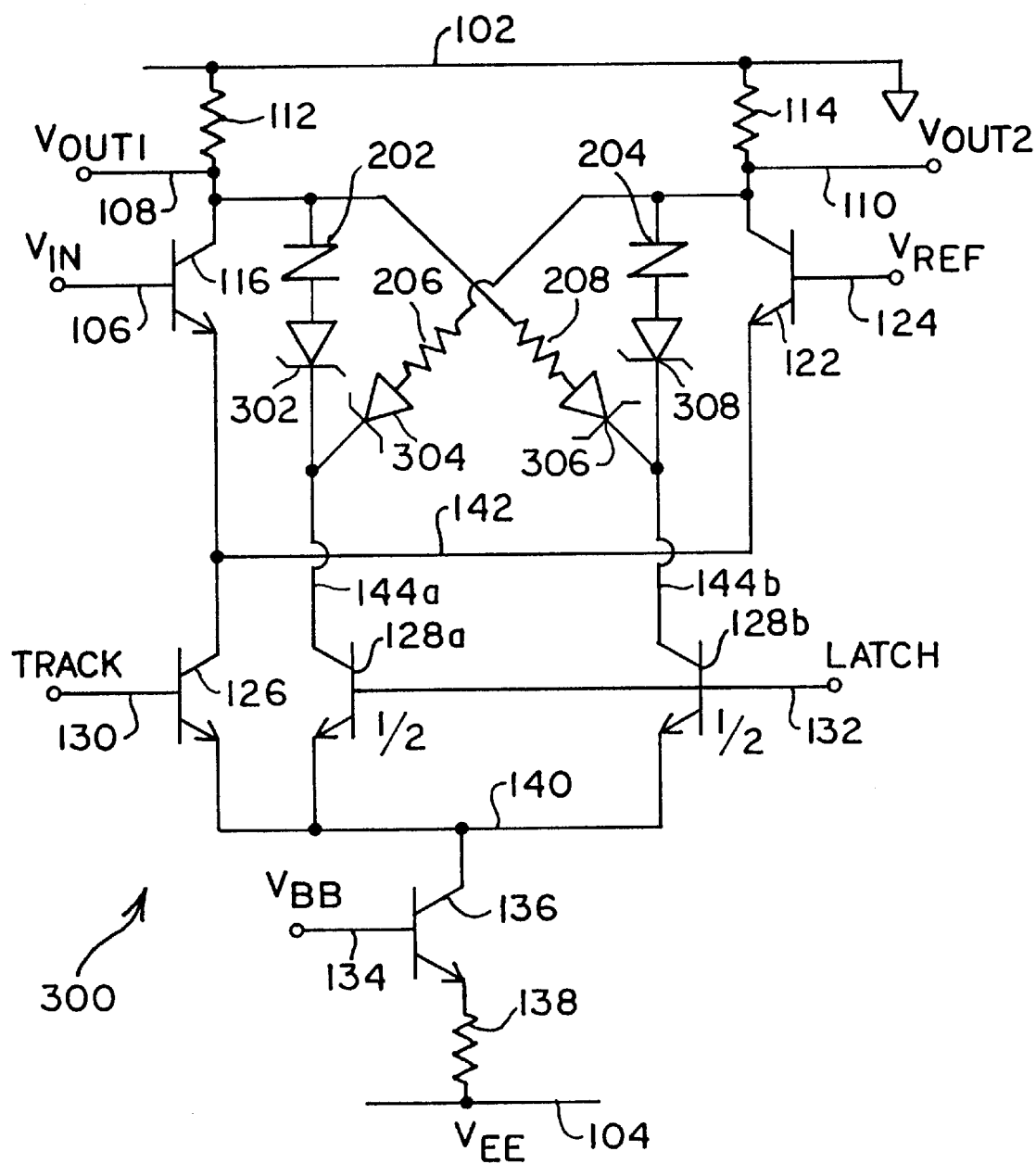
FIG. 3 is a circuit diagram of an alternative embodiment of a latching comparator using resonant tunneling diodes and Schottky diodes according to the present invention.

FIG. 3 is circuit diagram of alternative circuitry for a latching comparator 300 according to the present invention. As compared to the latching comparator 200, latching comparator 300 adds Schottky diodes 302, 304, 306 and 308 to further improve performance over the embodiment of FIG. 2. In particular, Schottky diode 302 is connected between RTD 202 and internal latch node 144a. Schottky diode 304 is connected between resistor 206 and internal latch node 144a. Schottky diode 308 is connected between RTD 204 and internal latch node 144b. Schottky diode 306 is connected between resistor 208 and internal latch node 144b. It is noted that Schottky diodes and their device characteristics are known.

In operation, the Schottky diodes 302, 304, 306 and 308 prevent current flow between the output nodes 108 and 110. This modification from FIG. 2 allows for faster discharge of the RTD and resistor nodes during the tracking mode (TRACK=high) and thereby lowers the tracking recovery time. As with the embodiment of FIG. 2, the latching speed of the embodiment of FIG. 3 is not limited by the $f_T$ of the transistors 118 and 120 of the prior latching comparator 100.

It is noted that device values and parameters for the latching comparator 200 and the latching comparator 300 may be selected to meet the desired design requirements, including the sampling frequency and the frequency of the input signal. These choices will also depend upon process capabilities and limitations and design considerations. For example, the semiconductor material in which the latching comparator is integrated may be gallium arsenide. The parasitic capacitance ($C_P$) between the collector of transistor 116 and the collector of transistor 122 may be 7 fF. The resistors 112 and 114 may be matched and have values of 800 ohms. The resistors 206 and 208 may also be matched and have values of 650 ohms. As further example, the device area for the RTDs may be a 0.9 $\mu m^2$, and the transistor sizing may be 5×5 $\mu m^2$, and the Schottky diode sizing may be 3×3 $\mu m^2$.

It is again noted that the above sizings depend upon the desired device characteristics in view of design considerations. It is also noted that the dimensioning and relative site ratios of the resistors 112 and 114 and the cross-coupled resistors 206 and 208 with respect to the area selected for the RTDs 202 and 204 are important for proper operation of the latching comparator 200 and the latching comparator 300. It is also noted that to match the resistors and the RTDs and get high yields depending upon the process being utilized, it may be advantageous to make the resistors by serially stringing together RTDs so that they do not flip states. In this way, process fluctuations will tend to effect the resistors and the RTDs similarly and not destroy the desired relative size ratios of these devices.

Figure 4:
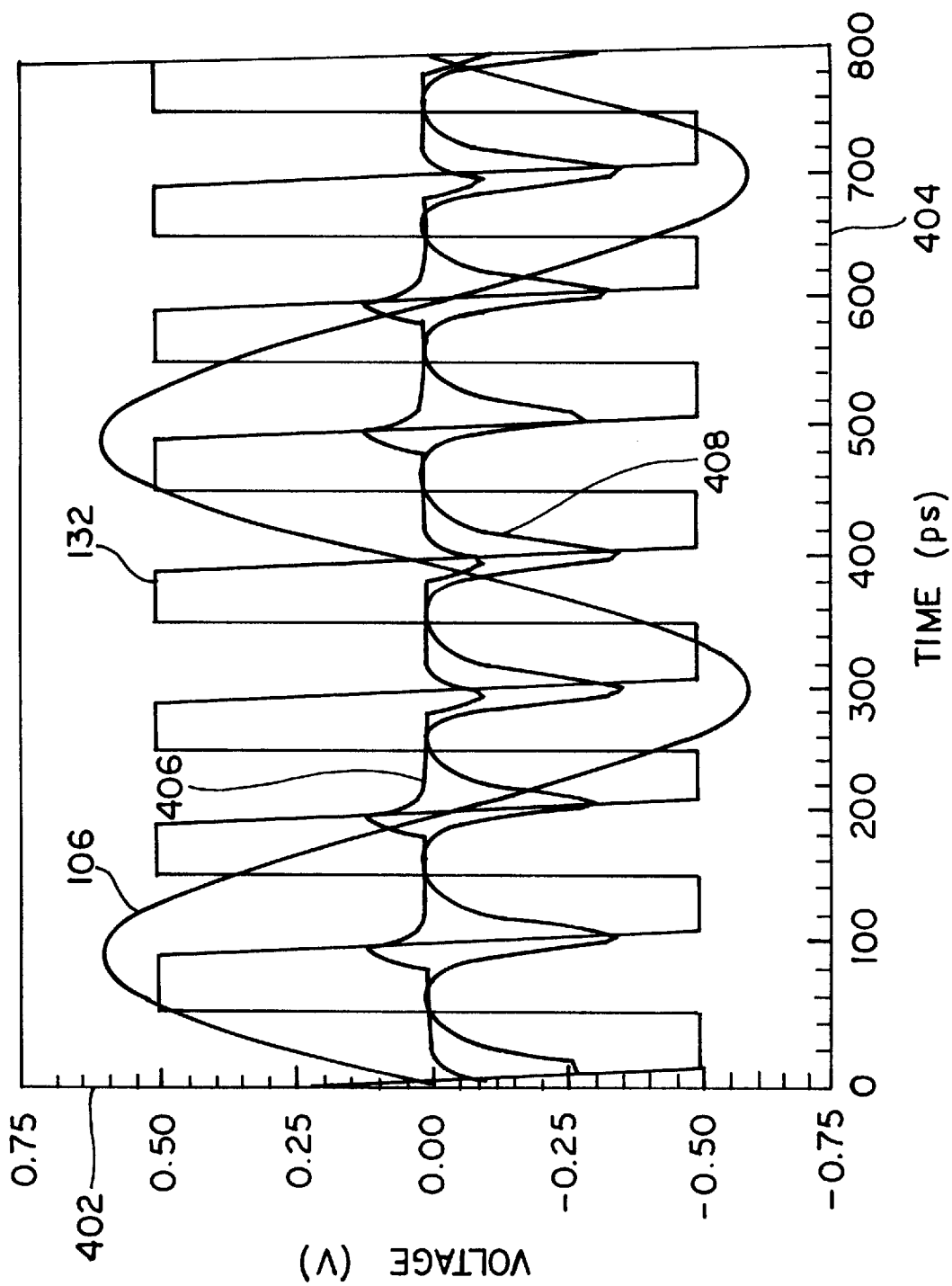
FIG. 4 is a graphical representation of example responses for a prior latching comparator and a latching comparator according to the present invention.

FIG. 4 represents a graphical depiction of the performance of the latching comparator 200 of FIG. 2 according to the present invention, and the latching comparator 100 of FIG. 1 (Prior Art). The x-axis 404 represents time in pico-seconds (ps), and the y-axis 402 represents the differential output voltage (V) between output node ($V_{OUT2}$) 110 and output node ($V_{OUT1}$) 108. The latch signal (LATCH) 132 is shown and has been positively offset for purposes of FIG. 4. It is noted that the track signal (TRACK) 130 is complimentary to the latching signal (LATCH) 132 and is not shown. The input signal ($V_{IN}$) 106 is also shown and is scaled at 1000-times for purposes of FIG. 4. Signal 406 represents the differential output voltage between output node ($V_{OUT2}$) 110 and output node ($V_{OUT1}$) 108 for the RTD-based circuitry of FIG. 2. Signal 408 represents the differential output voltage between output node ($V_{OUT2}$) 110 and output node ($V_{OUT1}$) 108 for the transistor-only circuitry of FIG. 1 (Prior Art).

To test the circuitry, the amplitude of the input signal 106 was reduced until the transistor-only circuitry of FIG. 1 (Prior Art) failed to follow the input signal information. At this failure point, the latching signal 132 was clocked at 10 GHz and had 1 V peak-to-peak amplitude. The input signal 106 was a 2.5 GHz sinusoidal signal and had a 1.2 mV peak-to-peak amplitude. As shown in FIG. 4, the output signal 408 of the transistor-only circuitry is stuck in a low output state and, therefore, is no longer listening to the input signal. Thus, at an input amplitude variation of 0.6 mV from a reference level, the transistor-only circuitry of FIG. 1 (Prior Art) failed. In comparison, the circuitry of FIG. 2 according to the present invention still latches the correct sign of the input signal 106. Furthermore, upon lowering the input amplitude further, the circuitry of FIG. 2 still did not stick, although the quality of the latch output did tend to decrease.

As a further comparison, hysteresis characteristics w%ere also investigated by studying the phase of the Fourier transformed quantizer outputs for various input signal amplitudes. Hysteresis is a degenerative property of a comparator circuit in which the quantizer decision is dependent in part upon the previous state of the quantizer. Ideally, the quantizer decision is based solely upon a measure of the current state of the input. Hysteresis causes an input-amplitude-dependent decision delay that is noticeable at input amplitudes well above the value for which the quantizer gets stuck or its output quality greatly decreases. For example, the input amplitude for which the comparator delay relative to a large amplitude becomes 10% of the clock signal period (e.g., 10 ps for FIG. 4) is a parameter that can be used to quantify hysteresis magnitude in the latching comparators of FIG. 1 (Prior Art) FIG. 2 and FIG. 3. For the transistor-only comparator of FIG. 1 (Prior Art), this amplitude was found to be 6.0 mV. For the comparator of FIG. 2, this amplitude was found to be 0.5 mV. For the comparator of FIG. 3, this amplitude was found to be 0.3 mV. Thus, the comparator circuitry of the present invention provides significantly improved performance (i.e., over 3 bits better) in terms of hysteresis over the prior implementation of FIG. 1 (Prior Art). This significantly lower hysteresis is believed to be related in part to the elimination of the relatively large and nonlinear base-emitter capacitance of the two latching transistors 118 and 120 in the circuitry of FIG. 1 (Prior Art).

As a still further comparison, aperture time distortion characteristics were also investigated by studying the appearance of even-order harmonics in quantizer Fourier spectrum magnitude plots using quantizer linearity theory. The relative size of even-order harmonics provides an indication of the level of errors in the quantizer output. This investigation revealed that the energy associated with even harmonics for the circuitry of FIG. 1 (Prior Art) was about –50.3 dB below the energy of the main peak. For the circuitry of FIG. 2, according to the present invention, the energy associated with even harmonics was about –58.3 dB below the energy of the main peak. And, for the circuitry of FIG. 3, according to the present invention, the energy associated with even harmonics was about –68.3 dB below the energy of the main peak. These results show that the circuitry of the present invention provides a significant advantage in the amount of errors present in the quantizer output.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements or materials may be substituted for those illustrated and described herein, and certain features of the invention may be utilized independently of the use of other features, all as would be apparent to one skilled in the art after having the benefit of this description of the invention.

We claim:

1. A latching comparator, comprising:
    a differential amplifier having a first and second input nodes, having a first and second output nodes, and having an internal track node;
    a first two-terminal device with a negative differential operating resistance connected between the first output node and a first internal latch node;
    a second two-terminal device with a negative differential operating resistance connected between the second output node and a second internal latch node;
    a first cross-coupled resistor connected between the second output node and the first internal latch node;
    a second cross-coupled resistor connected between the first output node and the second internal latch node;
    a bias circuit;
    a first latch switch circuit having a first latch mode signal as an input, the first latch switch circuit being coupled between the first internal latch node and the bias circuit and being configured to control current flow through the first two-terminal device and the first cross-coupled resistor;
    a second latch switch circuit having a second latch mode signal as an input, the second latch switch circuit being coupled between the second internal latch node and the bias circuit to control current flow through the second two-terminal device and the second cross-coupled resistor; and
    a track switch circuit having a track mode signal as an input, the track switch circuit being coupled between the internal track node and the bias circuit to control current flow through the differential amplifier.

2. The latching comparator of claim 1, wherein the first and second two-terminal devices are tunnel diodes.

3. The latching comparator of claim 2, wherein the tunnel diodes are resonant tunneling diodes.

4. The latching comparator of claim 1, wherein the first and second cross-coupled resistors comprise a plurality of serially connected resonant tunneling diodes.

5. The latching comparator of claim 1, wherein the reference signal is a DC signal.

6. The latching comparator of claim 1, wherein the differential amplifier comprises two transistors differentially connected.

7. The latching comparator of claim 1, wherein a common latch mode control signal provides the first and second latch mode signals.

8. The latching comparator of claim 7, wherein the track switch circuit comprises a first transistor having the track mode signal as a control voltage and the first and second latch switch circuits comprise a second transistor and a third transistor both having the common latch mode signal as a control voltage.

9. The latching comparator of claim 8, wherein the first, second and third transistors are hetero-junction bipolar transistors.

10. The latching comparator of claim 7, wherein the latch mode signal matches the track mode signal except for being offset in phase from the track mode signal by 180 degrees.

11. The latching comparator of claim 7, wherein the input signal and the track mode signal have frequencies above 1 GHz.

12. A latching comparator, comprising:
    a differential amplifier having a first and second input nodes and having a first and second output nodes, and having an internal track node;
    a first two-terminal device with a negative differential operating resistance connected between the first output node and a first internal node;
    a second two-terminal device with a negative differential operating resistance connected between the second output node and a second internal node;
    a first cross-coupled resistor connected between the second output node and the first internal node; and
    a second cross-coupled resistor connected between the first output node and the second internal node;
    wherein the first and the second internal nodes comprise internal latch nodes;
    a first Schottky diode connected in series with the first two-terminal device between the first output node and the first internal node;
    a second Schottky diode connected in series with the second two-terminal device between the second output node and the second internal node;
    a third Schottky diode connected in series with the first cross-coupled resistor between the second output node and the first internal node; and
    a fourth Schottky diode connected in series with the second cross-coupled resistor between the first output node and the second internal node.

13. The latching comparator of claim 12, wherein the first and second two-terminal devices are resonant tunneling diodes.

14. The latching comparator of claim 12, further comprising mode selection circuitry coupled to the internal track node and the internal latch node and having a track mode signal and a latch mode signal as inputs.

15. The latching comparator of claim 14, wherein the mode selection circuitry comprises a first transistor having the track mode signal as a control voltage and having a second transistor and a third transistor both having the latch mode signal as a control voltage.

16. The latching comparator of claim 15, wherein the first, second and third transistors are hetero-junction bipolar transistors.

17. The latching comparator of claim 14, wherein the latch mode signal matches the track mode signal except for being offset in phase from the track mode signal by 180 degrees.

18. The latching comparator of claim 14, wherein the input signal and the track mode signal have frequencies above 1 GHz.

19. A method for converting an analog input signal into digital information, comprising:
    comparing a first and second input signals with a differential amplifier to produce a differential output signal;
    latching the differential output signal with latching circuitry that includes first and second cross-coupled resistors and first and second two-terminal devices having negative differential operating resistances, the latching circuitry being coupled between differential output nodes of the differential amplifier and latching control circuitry, the latching circuitry comprising first and second latch switch circuits;

providing a bias circuit coupled to the latching circuitry through the first and second latch switch circuits and to the differential amplifier through a track switch circuit;

controlling current flow through the first cross-coupled resistor and the first two-terminal device with the first latch switch circuit;

controlling current flow through the second cross-coupled resistor and the second two-terminal device with the second latch switch circuit; and controlling the current flow through the differential amplifier with the track switch circuit.

20. The method of claim 19, wherein the two-terminal devices are resonant tunneling diodes.

21. The method of claim 19, wherein the comparing step comprises asserting a track signal coupled to tracking control circuitry to activate the differential amplifier.

22. The method of claim 19, wherein the latching step comprises asserting a latch signal to the latching control circuitry to activate the latching circuitry so that it latches the state of the differential output signal.

23. A method for converting an analog input signal into digital information, comprising:

comparing a first and second input signal with a differential amplifier to produce a differential output signal; and latching the differential output signal high or low with latching circuitry that includes cross-coupled resistors and two-terminal devices having negative differential operating resistances, the latching circuitry being coupled between differential output nodes of the differential amplifier and latching control circuitry;

wherein the latching circuitry further comprises Schottky diodes connected in series with the two-terminal devices and the cross-coupled resistors.

* * * * *